United States Patent
Peng et al.

(10) Patent No.: US 9,263,993 B2
(45) Date of Patent: Feb. 16, 2016

(54) LOW PASS FILTER WITH COMMON-MODE NOISE REDUCTION

(71) Applicant: MEDIATEK INC., Hsin-Chu (TW)

(72) Inventors: Tzu-Hsuin Peng, Taoyuan County (TW); Chih-Hong Lou, Yilan County (TW); Chao-Hsin Lu, Hsinchu County (TW); Chi-Yun Wang, Tainan (TW); Chih-Jung Chen, Hsinchu (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 23 days.

(21) Appl. No.: 14/259,120

(22) Filed: Apr. 22, 2014

(65) Prior Publication Data

US 2015/0303880 A1 Oct. 22, 2015

(51) Int. Cl.
| | |
|---|---|
| H03K 5/00 | (2006.01) |
| H03F 1/26 | (2006.01) |
| H03F 3/45 | (2006.01) |
| H03H 11/04 | (2006.01) |
| H03H 11/12 | (2006.01) |

(52) U.S. Cl.
CPC .............. *H03F 1/26* (2013.01); *H03F 3/45479* (2013.01); *H03H 11/0405* (2013.01); *H03H 11/1217* (2013.01); *H03F 2200/129* (2013.01); *H03F 2200/267* (2013.01); *H03F 2203/45061* (2013.01); *H03F 2203/45116* (2013.01)

(58) Field of Classification Search
CPC ........................................................ H03F 1/26
See application file for complete search history.

(56) References Cited

U.S. PATENT DOCUMENTS

| | | |
|---|---|---|
| 2003/0095006 A1 | 5/2003 | Ueno |
| 2004/0246049 A1 | 12/2004 | Itakura |
| 2012/0021712 A1 | 1/2012 | Mikhemar |
| 2013/0021183 A1* | 1/2013 | Ashburn et al. ............... 341/143 |

FOREIGN PATENT DOCUMENTS

EP        0 375 017 A2    6/1990

OTHER PUBLICATIONS

Paul D. Walker et al., An Approach to Fully Differential Circuit, Design without Common-Mode Feedback, IEEE Transactions on Circuits and Systems—II: Analog and Digital Signal Processing, Nov. 1996, pp. 752-762, vol. 43. No. 11, XP011012592, IEEE.

(Continued)

*Primary Examiner* — Daniel Puentes
(74) *Attorney, Agent, or Firm* — Winston Hsu; Scott Margo

(57) ABSTRACT

A low pass filter includes a first amplifier stage and a second amplifier stage. The first amplifier stage includes a differential operational amplifier, wherein the first amplifier stage is arranged to process a differential input signal to generate a differential intermediate signal, the differential input signal having a first input signal and a second input signal, and the differential intermediate signal having a first intermediate signal and a second intermediate signal. The second amplifier stage has no common-mode feedback and is arranged to process the differential intermediate signal to generate a differential output signal, wherein the differential output signal has a first output signal corresponding to the first input signal and a second output signal corresponding to the second input signal. Since the noisy common-mode feedback is removed from the second amplifier stage, the overall common-mode noise of the low pass filter can be decreased.

11 Claims, 1 Drawing Sheet

(56) References Cited

OTHER PUBLICATIONS

Adam Wyszyński et al., Avoiding Common-Mode Feedback in Continuous-Time gm-C Filters by Use of Lossy Integrators, May 30, 1994, pp. 281-284, XP010143321.

Óscar Casas et al., Basics of Analog Differential Filters, IEEE Transactions on Instrumentation and Measurement, Feb. 1996, pp. 275-279, vol. 45, No. 1, XP011023955, IEEE.

* cited by examiner

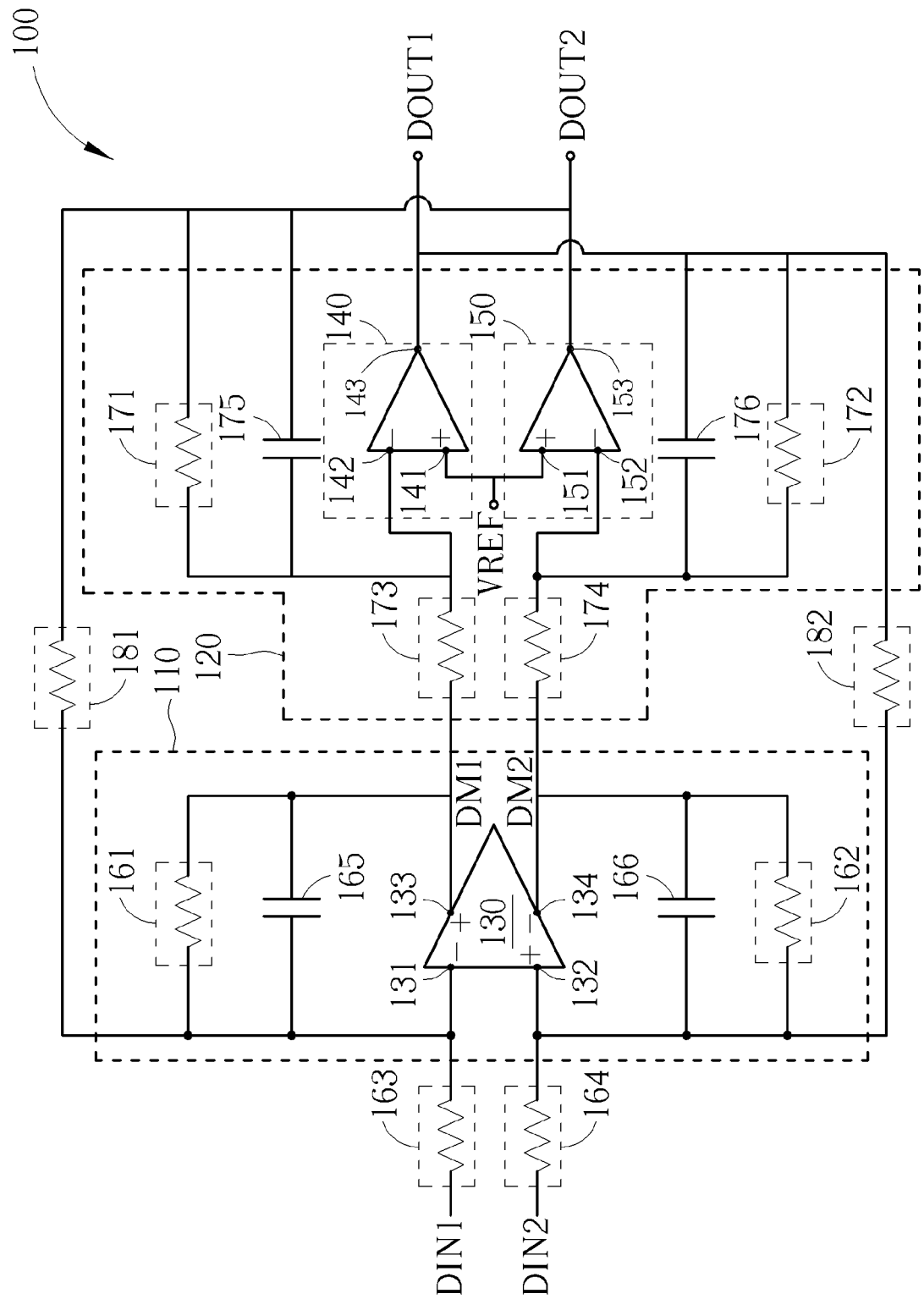

LOW PASS FILTER WITH COMMON-MODE NOISE REDUCTION

BACKGROUND

The disclosed embodiments of the present invention relate to a low pass filter circuit, and more particularly, to a low pass filter circuit capable of reducing/eliminating the common-mode (CM) noise passed to a filter output.

A low pass filter (LPF) is used to pass low frequency signals and attenuate signals with frequencies higher than the cutoff frequency. Low pass filters are commonly used in electronic circuits. When utilizing a low pass filter to process an input signal, CM interference such as CM noise will be generated in the output signal. This will deteriorate the characteristic and performance of the electronic circuit. Therefore, there is a need to provide a low pass filter capable of reducing/eliminating the CM noise which is passed to a filter output.

SUMMARY

In accordance with exemplary embodiments of the present invention, a low pass filter with common-mode noise reduction and an operation method thereof are proposed to solve the above-mentioned problem.

According to a first aspect of the present invention, a low pass filter is disclosed. The low pass filter includes a first amplifier stage and a second amplifier stage. The first amplifier stage includes a differential operational amplifier, wherein the first amplifier stage is arranged to process a differential input signal to generate a differential intermediate signal, the differential input signal having a first input signal and a second input signal, and the differential intermediate signal having a first intermediate signal and a second intermediate signal. The second amplifier stage has no common-mode feedback (CMFB) and is arranged to process the differential intermediate signal to generate a differential output signal, wherein the differential output signal has a first output signal corresponding to the first input signal and a second output signal corresponding to the second input signal.

Since the conventional noisy CMFB is removed from the second amplifier stage, the overall CM noise of the low pass filter can be decreased. In one example, the second amplifier stage utilizes two single-end amplifiers instead of a differential filter, and the CM voltage can be first regulated/defined by the first amplifier stage and be passed to the output of the second amplifier stage through the passive elements coupled to the input ends and the output ends of the two single-end amplifiers of the second amplifier stage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE shows a low pass filter according to a first embodiment of the present invention.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Please refer to the FIGURE, which shows a low pass filter 100 according to an embodiment of the present invention. The low pass filter 100 has a first amplifier stage 110, a second amplifier stage 120 and feedback resistive elements 181, 182. The first amplifier stage 110 has a differential operational amplifier (OP-amp) 130, which is a fully differential amplifier requiring a common-mode feedback (CMFB) stage to dynamically adjust the common-mode voltage presented at the amplifier input. The first amplifier stage 110 is arranged to process a differential input signal to generate a differential intermediate signal, wherein the differential input signal has a first input signal DIN1 and a second input signal DIN2, and the differential intermediate signal has a first intermediate signal DM1 and a second intermediate signal DM2. In this embodiment, the second amplifier stage 120 has no common-mode feedback (CMFB), and is arranged to process the differential intermediate signal to generate a differential output signal, wherein the differential output signal has a first output signal DOUT1 corresponding to the first input signal DIN1 and a second output signal DOUT2 corresponding to the second input signal DIN2. Both of the feedback resistive elements 182 and 182 are coupled between the first amplifier stage 110 and the second amplifier stage 120, to form feedback stages of the low pass filter 100.

Unlike the first amplifier stage 110, the second amplifier stage 120 does not employ a fully differential amplifier which requires a CMFB stage to dynamically adjust the common-mode voltage presented at the amplifier input. A pseudo differential amplifier may be employed by the second amplifier stage 120. As the CMFB contributes the majority of the common-mode (CM) noise, the CM noise introduced by the second amplifier stage 120 to a filter output (i.e. the differential output signal) is effectively reduced. Further details of the proposed low pass filter 100 are described in the following.

The differential operational amplifier 130 has an inverting input end (−) 131, a non-inverting input end (+) 132, a non-inverting output end (+) 133, and an inverting output end (−) 134, where the inverting input end 131 is arranged to receive the first input signal DIN1, the non-inverting input end 132 is arranged to receive the second input signal DIN2, the non-inverting output end 133 is arranged to output the first intermediate signal DM1, and the inverting output end 134 is arranged to output the second intermediate signal DM2.

The first amplifier stage 110 further has a plurality of passive elements, including a first resistive element 161, a second resistive element 162, a third resistive element 163, a fourth resistive element 164, a first capacitive element 165 and a second capacitive element 166. By way of example, but not limitation, each resistive element may be implemented using a resistor, and each capacitive element may be implemented using a capacitor. The first resistive element 161 is coupled between the inverting input end 131 and the non-inverting output end 133 of the differential operational amplifier 130. The second resistive element 162 is coupled between the non-inverting input end 132 and the inverting output end 134 of the differential operational amplifier 130. The first capacitive element 165 is coupled between the inverting input end 131 and the non-inverting output end 133 of the differential operational amplifier 130. The second capacitive element 166 is coupled between the non-inverting input end 132 and the inverting output end 134 of the differential operational amplifier 130. The third resistive element 163 is coupled between the first input signal DIN1 and the inverting input end 131 of the differential operational amplifier 130. The fourth resistive element 164 is coupled between the second input signal DIN2 and the non-inverting input end 132 of the differential operational amplifier 130.

The second amplifier stage 120 has a first amplifier 140 and a second amplifier 150. The first amplifier 140 has a first non-inverting input end (+) 141, a first inverting input end (−) 142, and a first output end 143. The first non-inverting input end 141 is arranged to receive a reference voltage (e.g., a fixed voltage) VREF. The first inverting input end 142 is arranged to receive the first intermediate signal DM1. Hence, the first amplifier 140 generates the first output signal DOUT1 at the first output end 143 according to the first intermediate signal DM1 and the reference voltage VREF. The second amplifier 150 has a second non-inverting input end (+) 151, a second inverting input end (−) 152, and a second output end 153. The first non-inverting input end 151 is arranged to receive the reference voltage VREF. The first inverting input end 152 is arranged to receive the second intermediate signal DM2. Hence, the second amplifier 150 generates the second output signal DOUT2 at the second output end 153 according to the second intermediate signal DM2 and the reference voltage VREF. As one input end of each of the first amplifier 140 and the second amplifier 150 is coupled to the reference voltage VREF, no CMFB is implemented in the second amplifier stage 120 to adjust the input CM voltage.

The second amplifier stage 120 further has a plurality of passive elements, including a first resistive element 171, a second resistive element 172, a third resistive element 173, a fourth resistive element 174, a first capacitive element 175 and a second capacitive element 176. By way of example, but not limitation, each resistive element may be implemented using a resistor, and each capacitive element may be implemented using a capacitor. The first resistive element 171 is coupled between the first inverting input end 142 of the first amplifier 140 and the second output end 153 of the second amplifier 150. The second resistive element 172 is coupled between the second inverting input end 152 of the second amplifier 150 and the first output end 143 of the first amplifier 140. The first capacitive element 175 is coupled between the first inverting input end 142 of the first amplifier 140 and the second output end 153 of the second amplifier 150. The second capacitive element 176 is coupled between the second inverting input end 152 of the second amplifier 150 and the first output end 143 of the first amplifier 140. The third resistive element 173 is coupled between the first intermediate signal DM1 and the first inverting input end 142 of the first amplifier 140. The fourth resistive element 174 is coupled between the second intermediate signal DM2 and the second inverting input end 152 of the second amplifier 150.

It should be noted that, although no input CM voltage is adjusted due to removal of the noisy CMFB circuit, the first resistive element 171 and the second resistive element 172 are intentionally added to define the output CM voltage. In other words, the CM voltage is first defined by the differential operational amplifier 130 with CMFB, and then passed by the first resistive element 171 and the second resistive element 172 to the filter output of the low pass filter 100.

In the second amplifier stage 120, CM noise of the differential output signal can be reduced/eliminated, since the CM noise on the resistive elements 161, 173, 171 can be reduced/eliminated by the first capacitive element 175, and the CM noise on the resistive elements 162, 174, 172 can be reduced/eliminated by the second capacitive element 176. Further, the CM noise of the operational amplifier 130 can be reduced/eliminated by the first capacitive element 175 and the second capacitive element 176. Moreover, the first resistive element 171 and the second resistive element 172 provide feedback paths to the second amplifier 150 and the first amplifier 140, respectively. Specifically, when the low pass filter 100 is operated in a direct current (DC) state, the first capacitive element 175 and the second capacitive element 176 form an open-circuit. At this moment, the output end 143 of the first amplifier 140 can be fed-back to the inverting input end 152 of the second amplifier 150 through the second resistive element 172, and the output end 153 of the second amplifier 150 can be fed-back to the inverting input end 142 of the second amplifier 140 through the first resistive element 171. The areas of the first resistive element 171 and the second resistive element 172 are both small. Hence, adding the first resistive element 171 and the second resistive element 172 to the second amplifier stage 120 does not significantly increase the total area of the low pass filter 100.

The dominant CM noise in the entire low pass filter 100 is introduced by the differential operational amplifier 130, and can be reduced/eliminated by the first capacitive element 175 and the second capacitive element 176. Since the second amplifier stage 120 does not employ any operational amplifier which may introduce dominant CM noise, and as the CM noise generated from all resistive elements can be reduced/eliminated by the capacitive elements implemented in the second amplifier stage 120, the CM noise of the differential output signal, including DOUT1 and DOUT2, may be greatly reduced or totally eliminated.

In a preferred embodiment, the capacitance value of the first capacitive element 175 is configured to be far larger than a parasitic capacitance value of the first amplifier 140, and a capacitance value of the second capacitive element 176 is configured to be far larger than a parasitic capacitance value of the second amplifier 150. In this way, beta ratio degradation will not occur when the transconductance (gm) of the first amplifier 140 and second amplifier 150 is increased.

Please note that the second amplifier stage 120 of the present invention can be arranged in various configurations as long as the element for outputting the differential output signal is not an element which may introduce undesired CM noise to the filter output. The second amplifier stage 120 depicted in FIG. 1 is provided as an exemplary embodiment, but the claimed scope of the present invention is not limited thereto. Further, the low pass filter 100 may be configured to have three or more amplifier stages. As long as the last amplifier stage does not utilize a noisy CMFB, the overall CM noise performance can be greatly improved.

Through the configurations and elements provided by the present invention, the CM noise of the low pass filter is greatly reduced. Hence, the characteristic and performance of an electronic circuit (e.g. a wireless transmitter) which employs the low pass filter of the present invention can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A low pass filter (LPF), comprising:
a first amplifier stage, comprising a differential operational amplifier, wherein the first amplifier stage is arranged to process a differential input signal to generate a differential intermediate signal, wherein the differential input signal has a first input signal and a second input signal, and the differential intermediate signal has a first intermediate signal and a second intermediate signal; and a second amplifier stage, having no common-mode feedback (CMFB) and arranged to process the differential intermediate signal to generate a differential output signal, wherein the differential output signal has a first output signal corresponding to the first input signal and a second output signal corresponding to the second input signal.

2. The LPF of claim 1, wherein the second amplifier stage comprises:

a first amplifier, having a first non-inverting input end, a first inverting input end and a first output end, wherein the first non-inverting input end is arranged to receive a reference voltage, the first inverting input end is arranged to receive the first intermediate signal, and the first output end is arranged to output the first output signal; and a second amplifier, having a second non-inverting input end, a second inverting input end, and a second output end, wherein the first non-inverting input end is arranged to receive the reference voltage, the first inverting input end is arranged to receive the second intermediate signal, and the second output end is arranged to output the second output signal.

3. The LPF of claim 2, wherein the second amplifier stage further comprises:

a first resistive element, coupled between the first inverting input end of the first amplifier and the second output end of the second amplifier; and a second resistive element, coupled between the second inverting input end of the second amplifier and the first output end of the first amplifier.

4. The LPF of claim 3, wherein the second amplifier stage further comprises:

a first capacitive element, coupled between the first inverting input end of the first amplifier and the second output end of the second amplifier; and a second capacitive element, coupled between the second inverting input end of the second amplifier and the first output end of the first amplifier.

5. The LPF of claim 4, wherein a capacitance value of the first capacitive element is larger than a parasitic capacitance value of the first amplifier; and a capacitance value of the second capacitive element is larger than a parasitic capacitance value of the second amplifier.

6. The LPF of claim 3, wherein the second amplifier stage further comprises:

a third resistive element, coupled between the first intermediate signal and the first inverting input end of the first amplifier; and a fourth resistive element, coupled between the second intermediate signal and the second inverting input end of the second amplifier.

7. The LPF of claim 1, wherein the differential operational amplifier has an inverting input end, a non-inverting input end, an inverting output end, and a non-inverting output end, where the inverting input end is arranged to receive the first input signal, the non-inverting input end is arranged to receive the second input signal, the non-inverting output end is arranged to output the first intermediate signal, and the inverting output end is arranged to output the second intermediate signal.

8. The LPF of claim 7, wherein the first amplifier stage further comprises:

a first resistive element, coupled between the inverting input end and the non-inverting output end of the differential operational amplifier; and a second resistive element, coupled between the non-inverting input end and the inverting output end of the differential operational amplifier.

9. The LPF of claim 8, wherein the first amplifier stage further comprises:

a first capacitive element, coupled between the inverting input end and the non-inverting output end of the differential operational amplifier; and a second capacitive element, coupled between the non-inverting input end and the inverting output end of the differential operational amplifier.

10. The LPF of claim 8, wherein the first amplifier stage further comprises:

a third resistive element, coupled between the first input signal and the inverting input end of the differential operational amplifier; and a fourth resistive element, coupled between the second input signal and the non-inverting input end of the differential operational amplifier.

11. The LPF of claim 1, further comprising:

a feedback stage, coupled between the first amplifier stage and the second amplifier stage.

* * * * *